(12) United States Patent
Jang

(10) Patent No.: US 6,784,477 B2
(45) Date of Patent: Aug. 31, 2004

(54) STRUCTURE OF A DEEP TRENCH-TYPE DRAM

(75) Inventor: Wen-Yueh Jang, Hsinchu (TW)

(73) Assignee: Winbond Electronics Corporation, Hsinchu (TW)

(*) Notice: Subject to any disclaimer, the term of this patent is extended or adjusted under 35 U.S.C. 154(b) by 0 days.

(21) Appl. No.: 10/043,194

(22) Filed: Jan. 14, 2002

(65) Prior Publication Data

US 2003/0132438 A1 Jul. 17, 2003

(51) Int. Cl.⁷ .............................................. H01L 27/108
(52) U.S. Cl. ..................... 257/301; 257/296; 257/297; 257/304
(58) Field of Search ............................... 257/296, 297, 257/300, 301, 327, 304; 438/246, 247, 249, 393, 248, 391, 392, 243, 386, 268

(56) References Cited

U.S. PATENT DOCUMENTS

| | | | | |
|---|---|---|---|---|
| 5,844,266 A | * | 12/1998 | Stengl et al. | 257/301 |
| 6,316,309 B1 | * | 11/2001 | Holmes et al. | 438/246 |
| 6,399,447 B1 | * | 6/2002 | Clevenger et al. | 438/268 |

* cited by examiner

*Primary Examiner*—Minhloan Tran
*Assistant Examiner*—Tan Tran

(57) ABSTRACT

A structure and a manufacture method of a DRAM device with deep trench capacitors are described. Each capacitor has a collar oxide layer with different height for electrical isolation and leakage reduction. Further, the DRAM device has strip-type active areas to improve some optical errors and thus reduce sufficiently the contact resistance of a buried strap film of a capacitor.

31 Claims, 10 Drawing Sheets

STRUCTURE OF A DEEP TRENCH-TYPE DRAM

FIELD OF THE INVENTION

The present invention relates to a structure and a method for fabricating semiconductor memory devices including random dynamic access memory (DRAM) devices. More particularly, the present invention relates to a structure and method of fabricating a DRAM device with deep trench capacitors.

BACKGROUND OF THE INVENTION

As semiconductor integration continuously increases, device dimensions are necessarily accordingly decreased. Hence the conventional scaling techniques are limited by the stringent leakage requirement of devices. A conventional DRAM cell has a 2-dimensional transistor even though the capacitor thereof has a 3-dimensional design. The integration of DRAM cell array is thereby limited.

Grurning et al. suggest that a sub-8F2 DRAM cell comprising a deep trench capacitor and a vertical transistor both in a deep trench can greatly increase the integration of DRAM cells (A Novel Trench DRAM Cell with a Vertical Access Transistor and Buried Strap (VERI BEST) for 4 Gb/16 Gb, p25, 1999 IEDM). Generally speaking, the traditional DRAM with a deep trench structure comprises a buried strap. The contact resistance of the buried strap (BSRc) is a critical parameter of a DRAM device and is hard to control well.

Specifically, reference is made to FIG. 1, which illustrates a top view of the surface of the substrate 10 of a DRAM memory device. In the figure are shown a capacitor array 12, a plurality of AA (active area) islands for controlling the capacitors in capacitor array 12 and shallow trench isolation regions 14 electrically insulating between the AA islands. In addition, it is noted that the row direction of the capacitor array illustrated in FIG. 1 is the direction of a bit line and the column direction of the capacitor array is the direction of a word line.

Reference is made to FIG. 2, which is the cross-sectional view taken along line 1—1 of FIG. 1. Each capacitor has a deep trench structure 16, which can be divided into an upper portion and a lower portion. The lower portion further comprises a bottom plate 18, a capacitor dielectric layer 20 and one part of a top plate 22. The upper portion comprises the other part of the top plate 22, a collar oxide layer 24 and a buried strap layer 26. For the purpose of electrical insulation between two capacitors, the active area of a DRAM device with deep trench structures traditionally has an island pattern.

However, as semiconductor integration continuously increases, dimensions of capacitors are accordingly decreased. The process window of photolithography is limited by the narrow distance between neighboring capacitors when patterning AA islands, described above. Moreover, the originally designated pattern of an active area is a rectangular. Under the influence of the optical effect, the real pattern of the active area is an island with the corners rounded. Accordingly, so far, sub-wavelength photolithography is used in the sub-quarter micron technology. Various resolution enhanced technologies (RET), such as optical proximity effect correction (OPC) and phase shift mask, must be applied in critical photo steps, but these further complicate the layout design and mask making.

Both a narrow process window of photolithography and complex resolution enhanced technology always make patterns lose their fidelity to their original design, which seriously affects device parameters. More specifically, the overall contact resistance of the buried strap is directly correlated to the intersection of the periphery of a deep trench and an AA pattern. A worst case scenario of alignment error between a deep trench structure and an active area along a bit line direction is shown in FIG. 3.

Compared with FIG. 2, which shows an ideal case of a DRAM device without any defects as described above, FIG. 3 shows a practical case with some defects, for example, a misalignment between a deep trench structure and an active area. More specifically, owing to alignment error, the top plate 22 does not contact the buried strap 26 well in the left capacitor of a capacitor subassembly, and accordingly, the left capacitor loses its intended function and fails.

SUMMARY OF THE INVENTION

It is an objective of this invention to provide a design of a DRAM device with deep trench structures to increase semiconductor integration.

It is another objective of this invention to provide strip-type active areas of a DRAM device to improve a process window of active area patterning and also reduce the contact resistance of a buried strap.

According to the objectives described above, the present invention discloses a DRAM device. The DRAM device comprises a plurality of strip-type active areas on a substrate, a plurality of shallow trench isolation regions on the substrate for isolating each of the active areas, a plurality of word lines above the active areas and the shallow trench isolation regions, and an array formed by overlapping the word lines and the active areas. The array includes a plurality of first overlapping portions and a plurality of second overlapping portions, with every two of the first overlapping portions separated by every two of the second overlapping portions on each of the active areas. Each of the first overlapping portions is next to each of the second overlapping portions on every two the neighboring active areas and a capacitor array on the active areas. Each of the capacitors is on each of the first overlapping portions, with the capacitor including a deep trench structure and a collar isolation. A memory cell is formed by the word line on one of the second overlapping portions and the capacitor on one of the first overlapping portions.

The present invention also discloses a method of fabricating a DRAM device. The DRAM comprises a substrate having a pad oxide layer and a silicon nitride layer formed in turn thereon and an capacitor array. Each of the capacitors has a deep trench structure therein. Every two of the capacitors are a capacitor subassembly. The capacitor subassemblies on a row of the capacitor array are not next to each other, while the capacitor subassemblies in the neighboring rows of the capacitor array are not next to each other. The method is to form a collar oxide layer on an upper sidewall region of the deep trench structure and then form a bottom plate on an interface region of the substrate and a lower sidewall portion of the deep trench structure. A dielectric layer is formed on an internal surface of the bottom plate in the deep trench structure by utilizing the collar oxide as a mask. A top plate is formed in the deep trench structure to cover the dielectric layer. Part of the collar oxide layer is removed to form a first collar portion and a second collar portion, in which the first collar portion is the adjacent portion of the collar oxide layer in the two capacitors of the capacitor subassembly and the second collar portion is the non-adjacent portion of the collar oxide layer in the two capacitors of the capacitor subassembly. The first collar portion is longer than the second collar portion in the depth direction of the deep trench structure. The first collar portion is used to isolate the neighboring capacitors and the second collar portion is used to reduce sufficiently a leakage current of the substrate surrounding thereof. A buried strap conductive layer is formed above the second collar portion and the top plate. A plurality of strip-type active areas and a plurality of shallow trench isolation regions are formed in turn thereon. A gate oxide layer is formed thereon and a plurality of word lines is formed on the columns of the capacitor array. An array is formed by overlapping the word lines and the active areas; the array includes a plurality of first overlapping portions and a plurality of second overlapping portions, with each of the first overlapping portions therein comprising each of the capacitor subassemblies. Finally, a plurality of sources and drains is formed on two sides of each the second overlapping portions, with a memory cell being formed by the word line on one of the second overlapping portions controlling the capacitor via the diffusion conductive region on one of the first overlapping portions.

BRIEF DESCRIPTION OF THE DRAWINGS

For a more complete understanding of the invention, reference is made to the following detailed description of the preferred embodiment taken in connection with the accompanying drawings in which.

DETAILED DESCRIPTION OF THE PREFERRED EMBODIMENT

The present invention discloses a DRAM device having strip-type active areas and deep trench structures of different heights to improve the disadvantages as described in the background. A preferred embodiment of the present invention is introduced to explain the spirit of the invention.

Figure 4A:
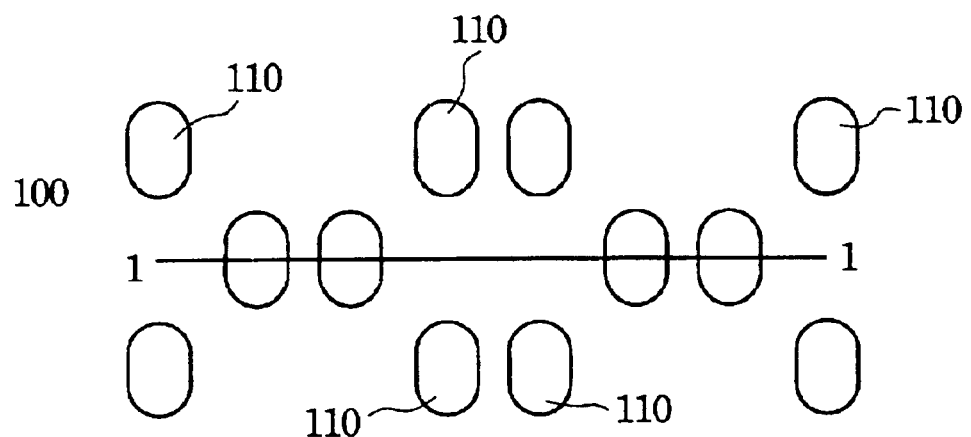
FIG. 4A schematically illustrates a top view of a DRAM device having a silicon substrate of the present invention.
Figure 4B:
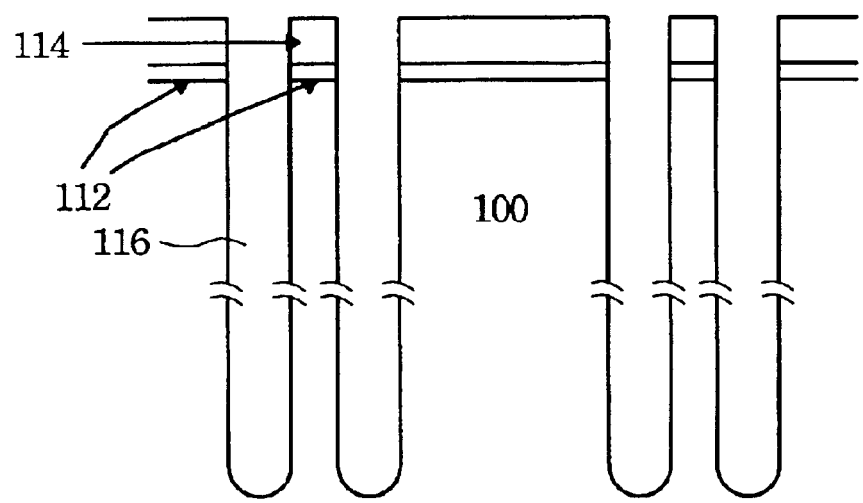
FIG. 4B schematically illustrates a cross-sectional view taken along line 1—1 of FIG. 4A.

Reference is made to FIG. 4A and FIG. 4B. FIG. 4A is a top view of a DRAM device having a P-type silicon substrate 100 and FIG. 4B is the cross-sectional view taken along line 1—1 of FIG. 4A. First, a silicon oxide layer 112 and a silicon nitride layer 114 are deposited in turn on the substrate 100. A capacitor array 110 with deep trench structures is subsequently formed in the substrate 100. Each row direction of the capacitor array 110 is a direction of a bit line, while each column direction of the capacitor array 110 is a direction of a word line. In the capacitor array 110, two neighboring capacitors can be regarded as a capacitor subassembly for a better understanding of the present invention. The capacitor subassemblies in a row of the capacitor array are not adjacent to each other and each capacitor subassembly in the neighboring rows of the capacitor array are also not adjacent to each other. In a preferred embodiment of the present invention, the depth of a deep trench structure 116 of a capacitor is about 7–8 $\mu$m.

Figure 5A:
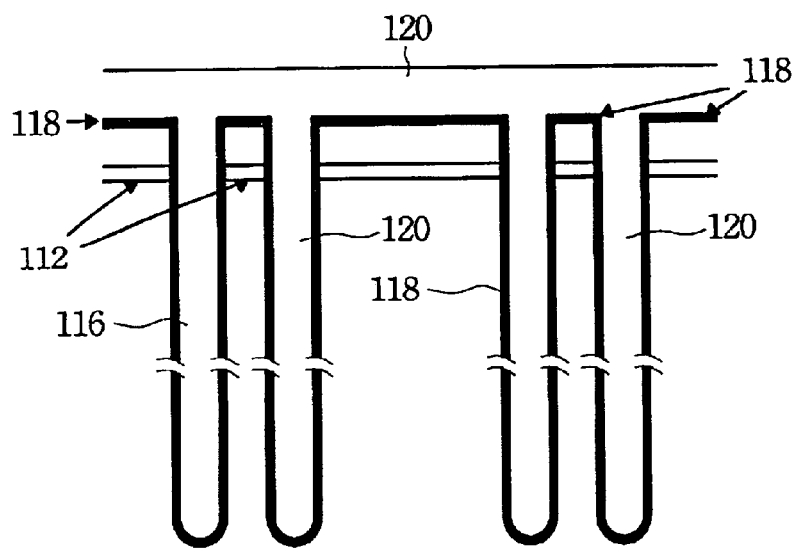
FIGS. 5A–5C schematically illustrates a lower portion of a deep trench structure of the present invention.
Figure 5B:
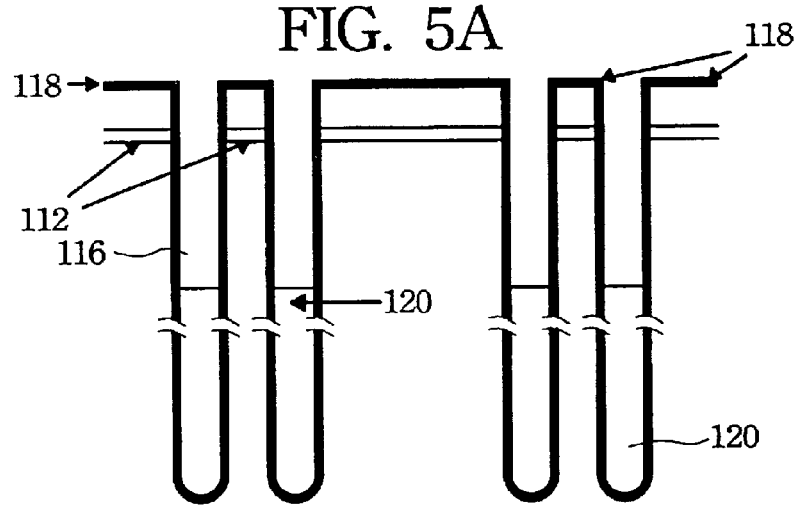

In FIG. 5A, a collar silicon nitride layer 118 is deposited to cover the substrate 100, and then the deep trench structure 116 is filled with a sacrificial photoresist 120 to cover the collar silicon nitride layer 118. Referring to FIG. 5B, part of the sacrificial photoresist 120 is removed to a predetermined depth of a lower portion of a deep trench capacitor by an etching process, leaving a portion of the sacrificial photoresist 120. Subsequently, part of the collar nitride layer 118 is etched while using the remaining lower portion of the sacrificial photoresist 120 as a mask. After removing the lower portion of the sacrificial photoresist 120, a lower portion of the collar nitride layer 118 remains, as illustrated in FIG. 5C.

Figure 5C:
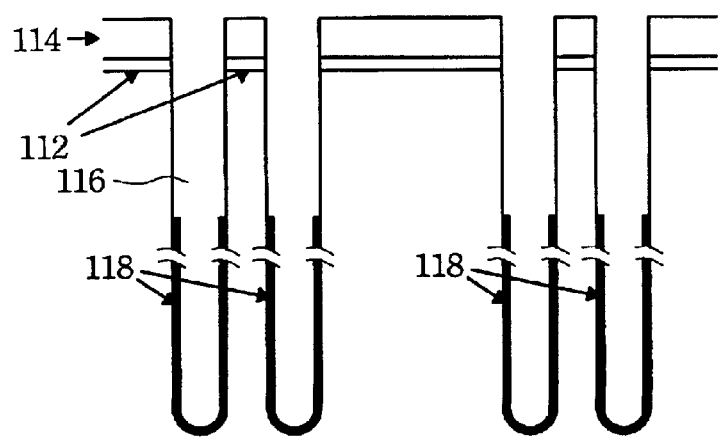
Figure 6A:
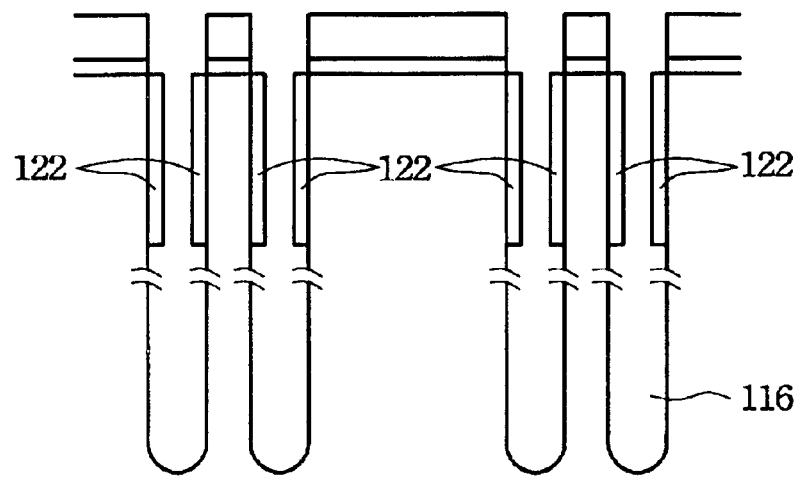
FIGS. 6A–6D schematically illustrates a bottom plate and a top plate of a deep trench capacitor of the present invention.

Reference is made to FIG. 5C and FIG. 6A. Using the lower portion of the collar nitride layer 118 as a mask, the collar silicon oxide layer 122 is formed on the upper sidewall region of the deep trench structure by a thermal process to a thickness of about 400 Å–500 Å. To determine the thickness of the collar silicon oxide layer 122, as mentioned above, two factors must be considered. One is that the collar silicon oxide layer 122 must be sufficiently thick to electrically insulate two neighboring capacitors of a capacitor subassembly. A further factor is that the thickness thereof reduces the parasitic leakage of the substrate outside the sidewall of the collar silicon oxide layer 122.

Figure 6B:
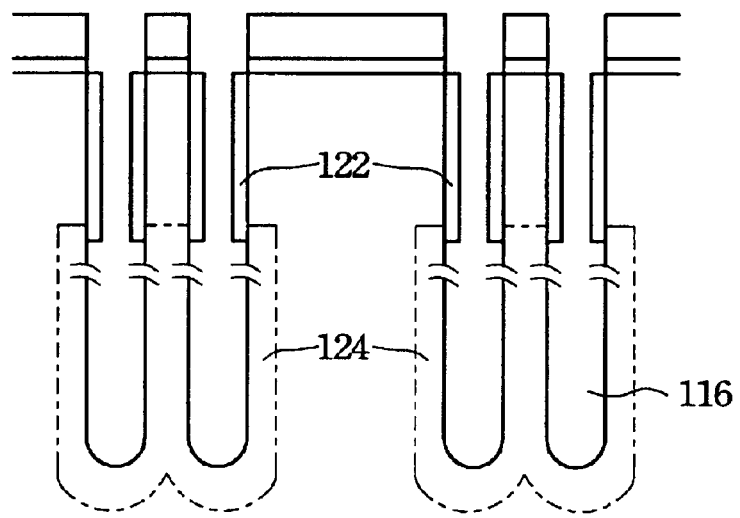
Figure 6C:
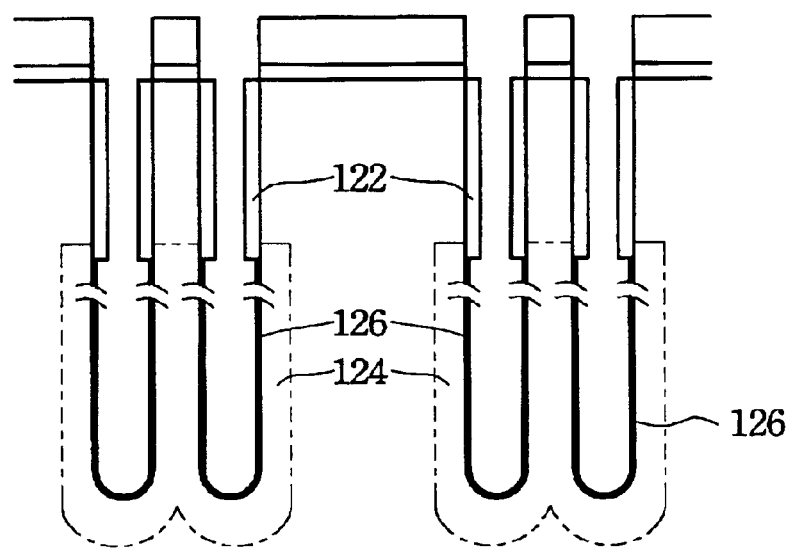

In FIG. 6B, an N-type impurity gas is used to dope the lower sidewall portion of a deep trench structure 116 with the collar oxide layer 122 serving as a mask and then a thermal diffusion process is performed to form a bottom plate 124. Next, as shown in FIG. 6C, a dielectric layer 126 is formed on an internal surface of the bottom plate 124 in the deep trench structure 116 with the collar oxide layer 122 serving as a mask. More specifically, the dielectric layer 126 is a composite layer comprising silicon nitride and silicon oxide. Dielectric layer 126 is formed by depositing a silicon nitride layer on the lower sidewall portion of the deep trench structure 116 with the collar oxide layer 122 serving as a mask. A thermal process is then performed to form a composite layer with an effective thin thickness. The deep trench structure is filled with a doped polysilicon layer comprising arsenic to form a top plate 128. More specifically, the top plate 128 can be formed by etching one part of the top plate 128 to a proper depth after filling with the doped polysilicon.

Figure 1:
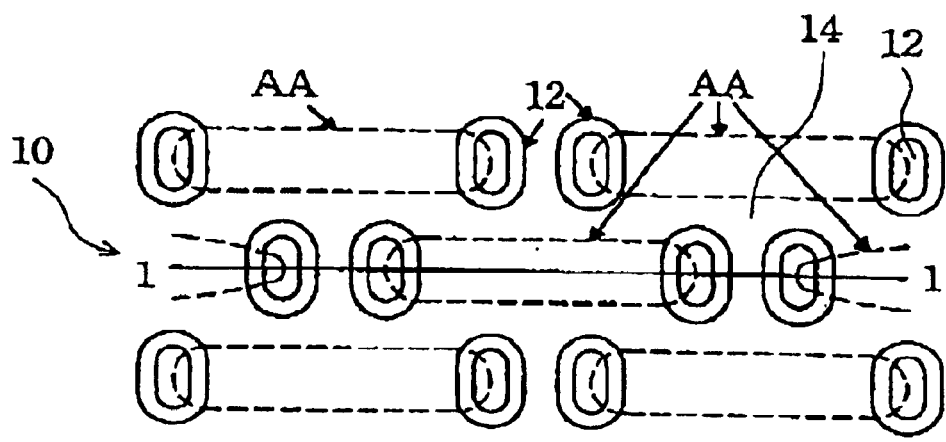
FIG. 1 schematically illustrates a top view of a substrate surface of a DRAM memory device.
Figure 2:
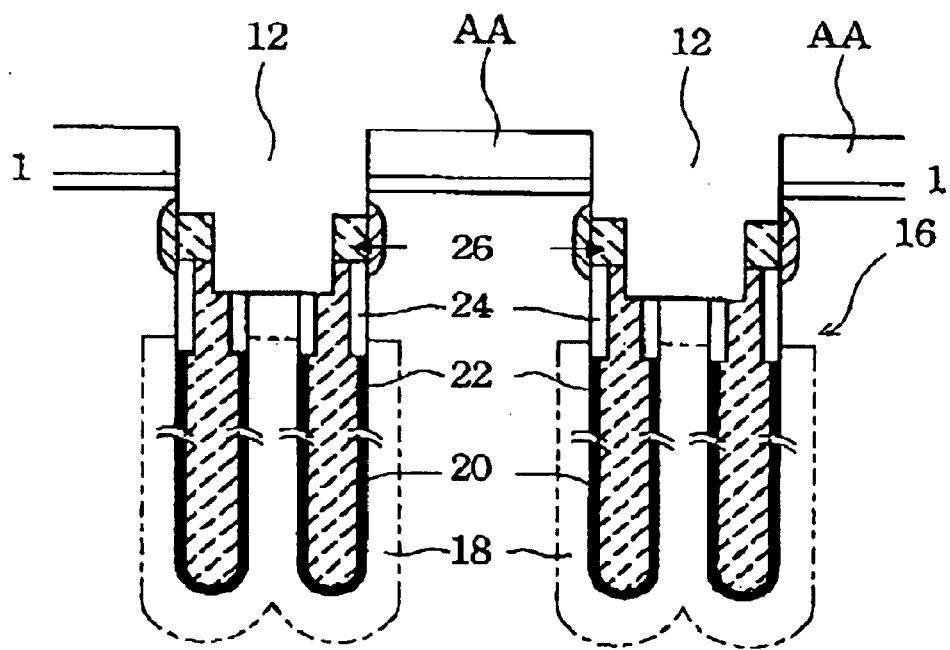
FIG. 2 schematically illustrates a cross-sectional view taken along line 1—1 line of FIG. 1.
Figure 3:
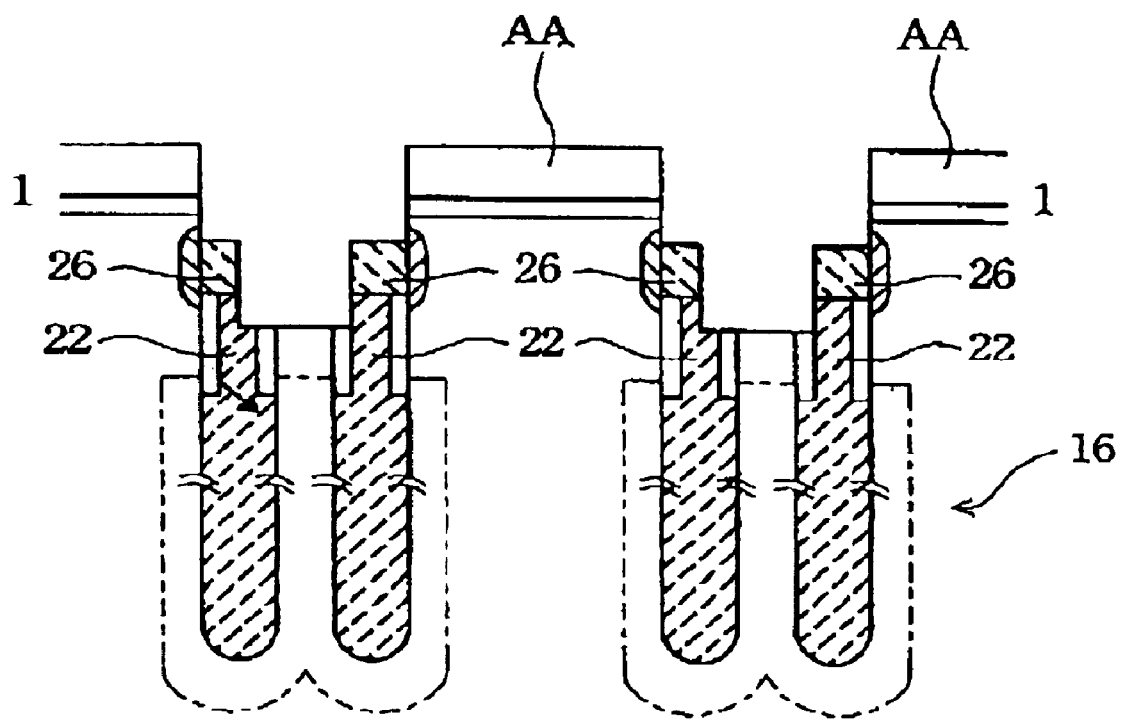
FIG. 3 schematically illustrates a practical case of the prior art with a misalignment between a deep trench structure and an active area.
Figure 6D:
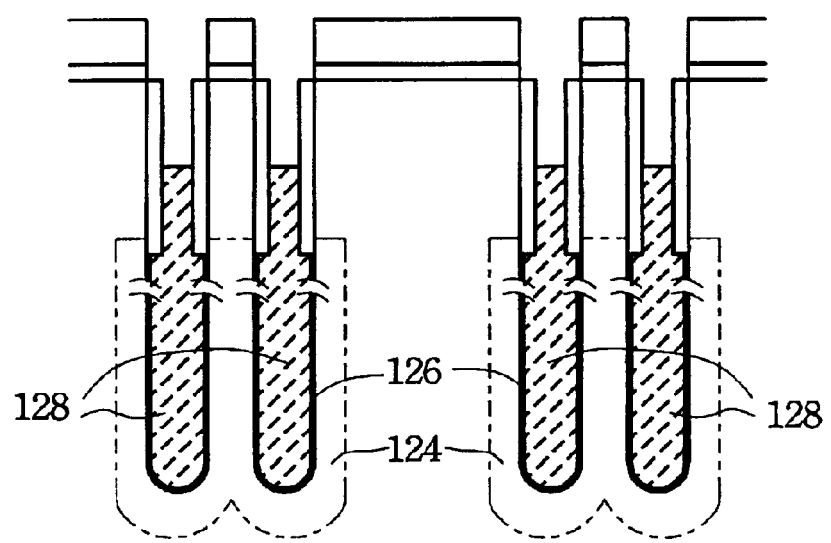

In FIGS. 1–2 and 6D, in a traditional process, the top plate (FIG. 6D) is used as a mask for etching one part of the collar oxide layer, above the top plate, to have the same depth as the top plate. Subsequently, a proper photoresist is used to pattern active areas as islands (as shown in FIG. 1) after buried strap layers are formed. Further, the shallow trench structure is filled with a dielectric layer to form an STI in a capacitor as shown in FIG. 2. However, some drawbacks are generated in the above traditional process, such as a narrow process window of photolithography, alignment error of mask, high contact resistance of BSRc, etc.

Figure 7A:
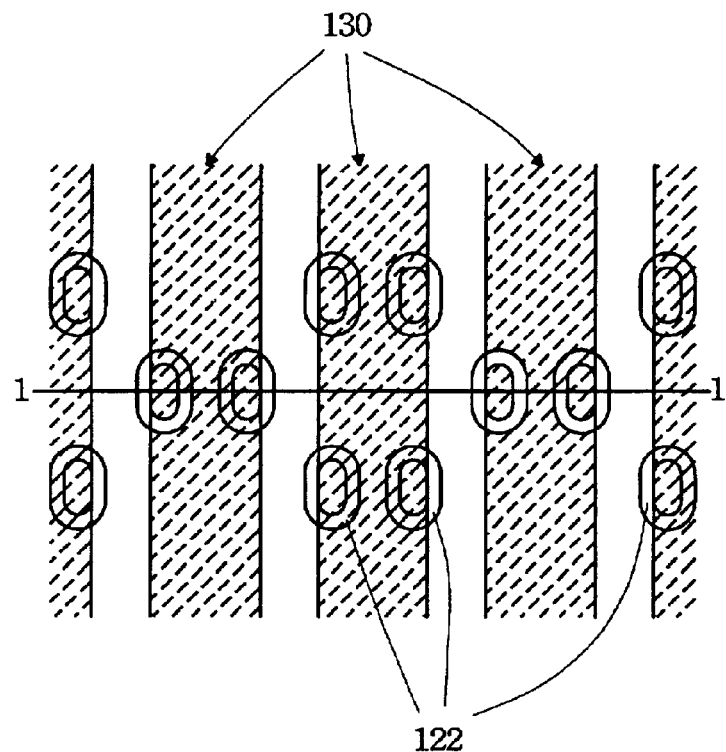
FIGS. 7A–7D schematically illustrates a deep trench capacitor of the present invention.

The present invention discloses a novel structure and a method of a DRAM device that can improve those disadvantages as described in the background. In FIG. 7A, some photoresist having strip patterns 130 is formed on the substrate to cover the neighboring portion of collar oxide layers in two neighboring capacitors of a capacitor subassembly. That is, the portions of the collar oxide layers which are not adjacent are exposed. Furthermore, the strip pattern photoresist 130 can be formed by two layers of generated photoresist in turn to solve a problem of deep focus of depth.

Figure 7B:
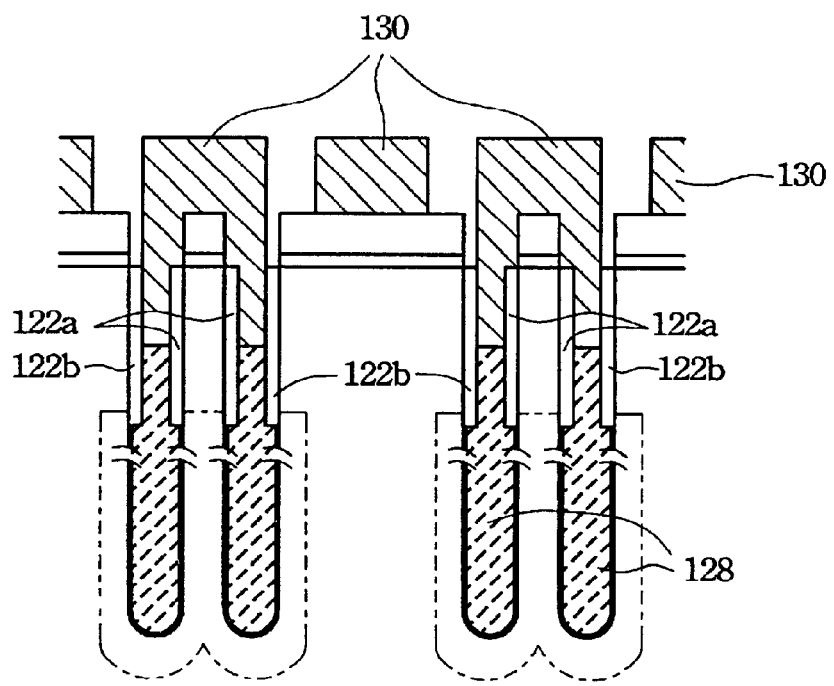

FIG. 7B is a cross-sectional view taken along line 1—1 of FIG. 7A. A collar oxide layer 122 has two portions. One is the first collar portion 122a and the other is the second collar portion 122b. More specifically, the first collar portions 122a are the adjacent parts of two neighboring capacitors, while the second collar portions 122b are the non-adjacent parts of two neighboring capacitors. The purpose of photoresist 130 is to preserve the first collar portion 122a of the collar oxide layer 122 in a deep trench capacitor and to etch the exposed part of the collar oxide, the second collar portion 122b. Consequently, the photoresist pattern in photolithographic processes of the present invention does not require high accuracy. The disadvantages as described in background will thus not happen in the present invention.

Figure 7C:
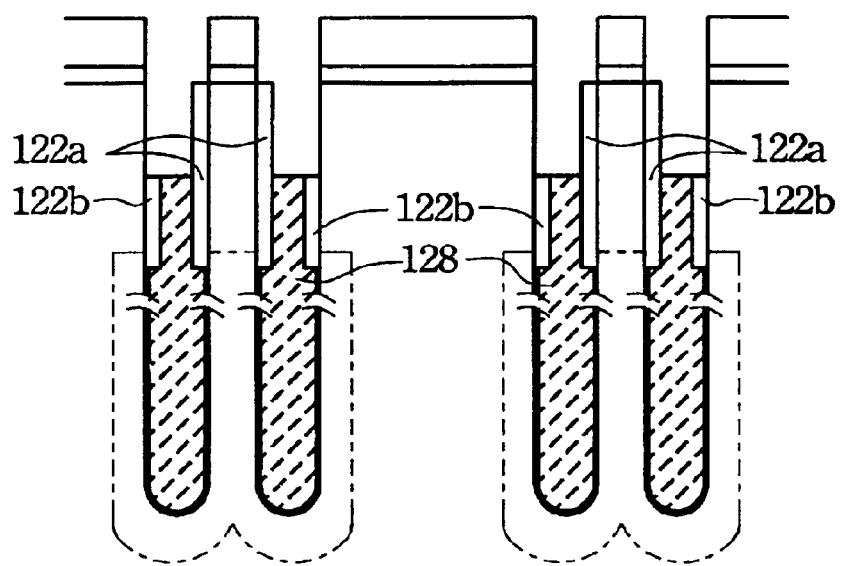

In FIG. 7C, the second collar portion 122b is partly etched and the photoresist 130 is then removed. The second collar portion 122b, after etching, has the same depth as the top plate 128. It is noted that the height of the first collar portion 122a is greater than that of the second collar portion 122b. The first collar portion 122a is sufficiently thick to electrically insulate two neighboring capacitors of a capacitor subassembly, while the second collar portion 122b is also thick enough to reduce the parasitic leakage of the substrate outside the sidewall thereof.

Figure 7D:
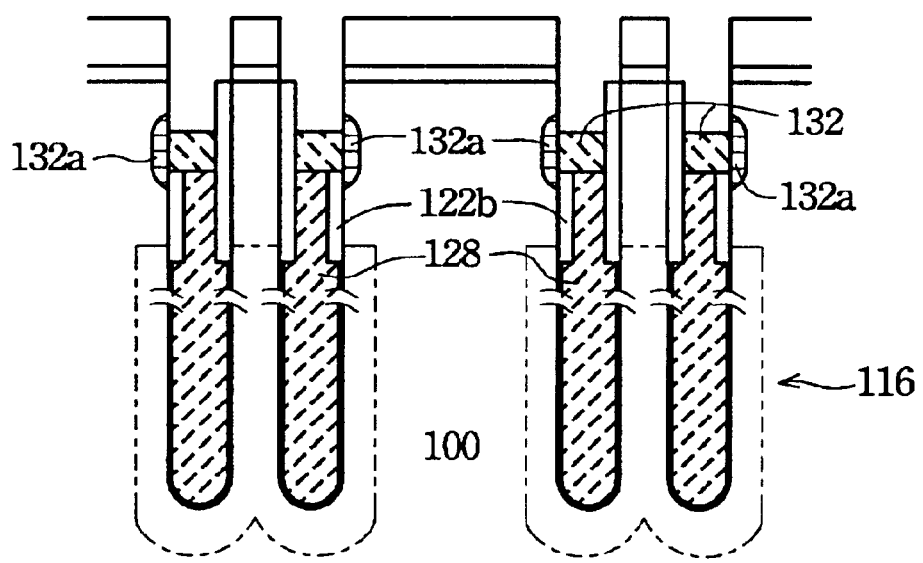

In FIG. 7D, a buried strap conductive layer 132 is formed on the top surface of the top plate 128 and the second collar portion 122b in the deep trench capacitor. In a preferred embodiment of the present invention, the buried strap conductive layer 132 is a doped silicon layer, which is formed by filling the deep trench with a silicon layer and then etching one part of it to a determined depth. An ion implant process, to dope the silicon layer, and a thermal process are subsequently performed to form a diffusion conductive region in the substrate 100 outside the conductive silicon layer 132 to connect the capacitor with source/drain regions, as shown in FIG. 7D.

Figure 8:
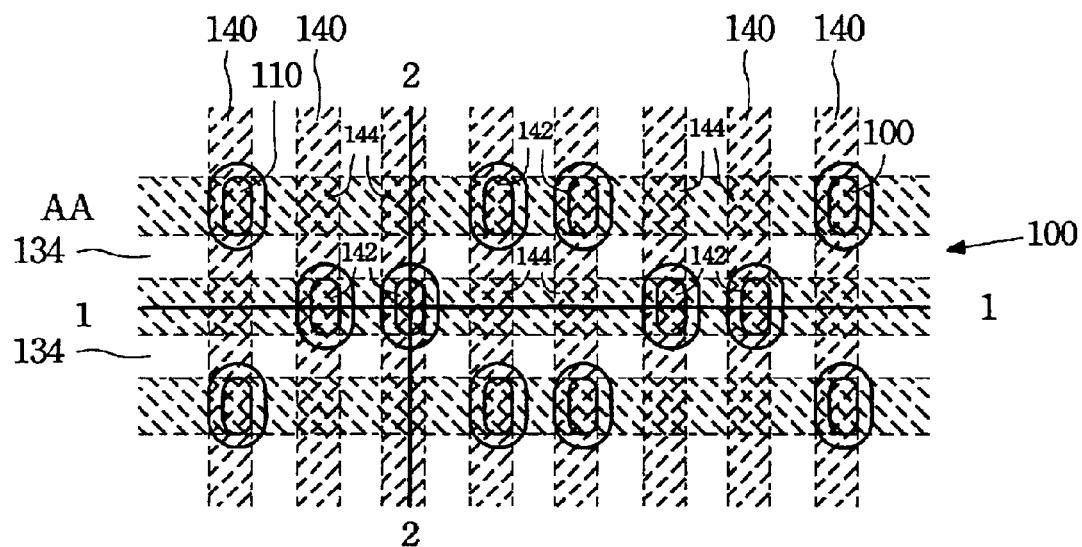
FIG. 8 schematically illustrates strip-type AA patterns, STI and word lines of the present invention.
Figure 9:
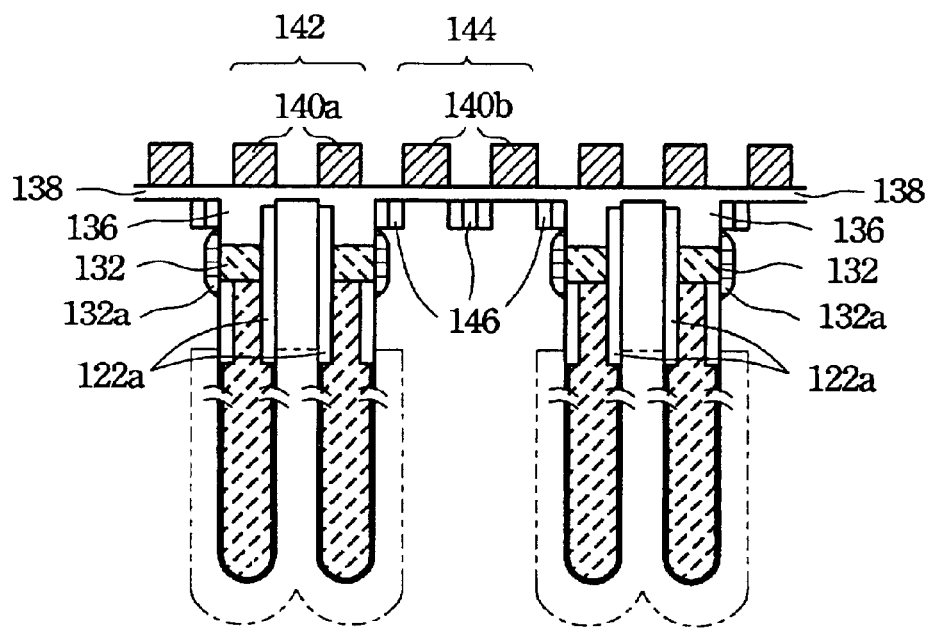
FIG. 9 schematically illustrates a cross-sectional view taken along line 1—1 of FIG. 8.

Referring to FIG. 8, in the direction of each row of the capacitor array 110, a patterning process of active areas is performed to form a plurality of strips of active areas AA and a plurality of strips of shallow trench isolation structures 134 therebetween. The STI structure is used to isolate each strip of active area AA. Meanwhile, as illustrated in FIG. 9, a cross-sectional view taken along line 1—1 in FIG. 8., the capacitors and the STI structure 134 are filled with a dielectric layer 136. The dielectric layer 136 is, for example, a silicon oxide layer. More particularly, the dielectric layer 136 above the buried strap conductive layer 132 is also called a trench top oxide (TTO). The dielectric layer 136 connects with the STI structure 134 in the direction of word lines. Later, a chemical mechanical polishing process is used to planarize the substrate surface.

With further reference to FIG. 9, a gate oxide layer 138 is formed. A plurality of word lines 140, here further subdivided into 140a and 140b, are subsequently formed on each column of the capacitor array 110. The word lines 140 are formed by depositing a polysilicon layer on the gate oxide layer 138, and then doping the polysilicon layer to decrease the resistance thereof sufficiently. A silicide layer is then deposited on the polysilicon layer, and together with the polysilicon layer, is patterned to form the word lines 140a and 140b. More specifically, the word lines overlap active areas to form an overlapping array, which comprises several first overlapping portions 142 and a plurality of second overlapping portions 144. Each first overlapping portions 142 therein contains one capacitor of each capacitor subassembly, while each second overlapping portion 144 does not.

Figure 10:
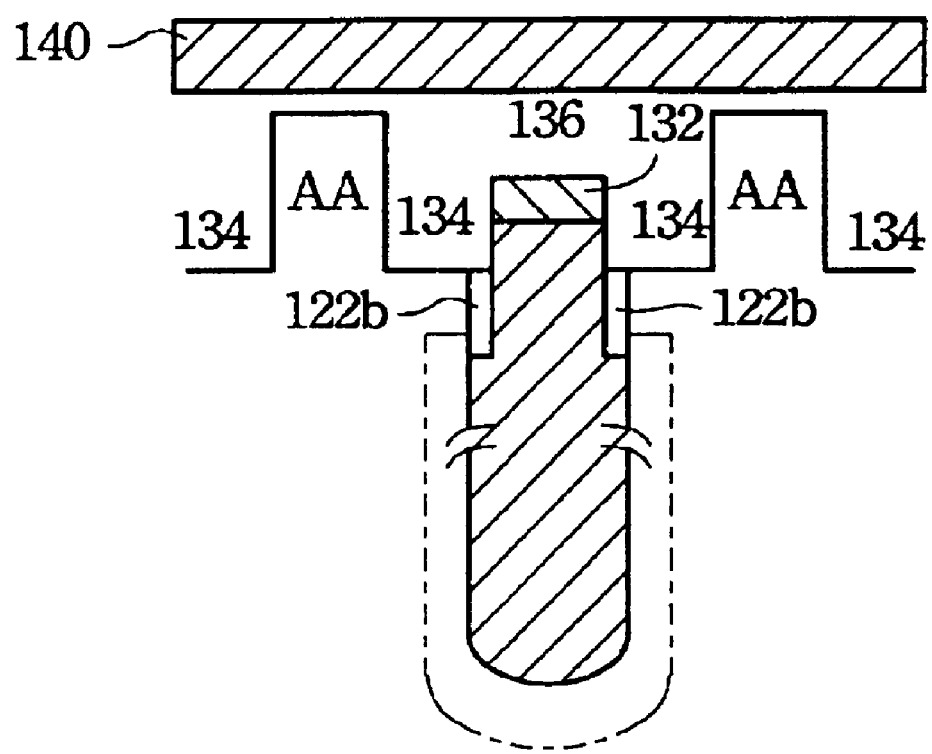
FIG. 10 schematically illustrates a cross-sectional view taken along line 2—2 of FIG. 8.

Reference is made to FIGS. 8–10, in which FIG. 10 is a cross-sectional view taken along line 2—2 of FIG. 8. In FIG. 9, a source/drain region 146 of a memory cell is formed on two sides of the second overlapping portion 144 of active areas. It is again noted that the word lines on the line 1—1 are divided into two kinds. The first part 140a above the first overlapping portion 142 is called a passing word line, while the other is the second part 140b above the second overlapping portion 144. A memory cell is controlled by the second part 140b of the word line, above the second overlapping portion 144, via the diffusion conductive region 132a and a buried strap conductive layer 132, beneath the neighboring overlapping portion 142.

In FIGS. 8–10, every capacitor of a DRAM cell of the present invention can be electrically insulated from the others by the design of active areas with a strip pattern AA, the collar oxide layer 122 with different heights, the trench top oxide layer 136 and its surrounding STI structure 134. Accordingly, both AA head rounding and AA head recession of the prior art are no longer troublesome issues in the present invention. In addition, alignment error in the word line direction is also not an issue due to the strip-type AA pattern. Since only AA size and alignment of the AA with the deep trench in word line direction are issues, the process window of this strip-type AA pattern of the present invention is greatly improved.

Moreover, in FIG. 9, the periphery of the buried strap conductive layer from the AA and the deep trench intersection can be maximized by the proposed strip-type AA pattern, which maximizes the contact area of the buried strap conductive layer, and accordingly, minimizes contact resistance BSRc. Besides, due to the additional mask step and strip-type AA pattern, both buried strap conductive layer and doped silicon layer are mostly untouched during AA patterning, which minimizes the sheet resistance of these film. These factors contribute to a low, well-controlled BSRc. On the other hand, although no STI structure exists between neighboring deep trenches, the collar oxide between neighboring deep trench still remains, and consequently the isolation between these two deep trench cells remains good.

There are three advantages of the proposed process and structure over those of the convention one.
1. BSRc can be reduced and controlled.
2. Process window of AA patterning can be greatly improved.
3. Because mask fabrication of a strip-type AA mask is less difficult than that of an island-type AA mask, both the mask price and delivery of the proposed strip-type AA mask are much easier than that of the island type.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent, and may be made by, persons of ordinary skill in the art having reference to this description. It is contemplated that such changes and additional embodiments are within the spirit and true scope of the invention as claimed below.

What is claimed is:

1. A Dynamic Random Access Memory (DRAM), comprising:
   a plurality of strip-type active areas on a substrate;
   a plurality of strip-type shallow trench isolation regions on the substrate for isolating each of the active areas, the active areas and the shallow trench isolations being alternatively and parallel arranged on the substrate;
   a plurality of word lines above the active areas and the shallow trench isolation regions, an array being formed by overlapping the word lines and the active areas, the array including a plurality of first overlapping portions and a plurality of second overlapping portions, wherein every two of the first overlapping portions are separated by every two of the second overlapping portions on each strip of the active areas and each of the first overlapping portions is next to each of the second overlapping portions on every two neighboring active areas; and
   a capacitor array in the active areas, each of the capacitors being in each of the first overlapping portions, the capacitor including a deep trench structure and a collar isolation, a first collar portion being on an adjacent portion of two of the neighboring capacitors, a second collar portion being on a non-adjacent portion of two of the neighboring capacitors, the first collar portion being longer than the second collar portion in a depth direction of the deep trench and a depth of the second collar portion being the same as a depth of the top plate, wherein a memory cell is formed by the word line in one of the second overlapping portions and the capacitor in one of the first overlapping portions.

2. The DRAM as recited in claim 1, wherein the deep trench structure of the capacitor comprises:
   a bottom plate on an interface region of the substrate and a lower sidewall portion of the deep trench structure;
   a dielectric layer, formed on an internal surface of the bottom plate; and
   a top plate, formed by filling the deep trench structure and covering the dielectric layer with a conductive material.

3. The DRAM as recited in claim 2, wherein the bottom plate is formed by thermal diffusion with an impurity gas to dope the lower sidewall portion of the deep trench structure.

4. The DRAM as recited in claim 2, wherein the dielectric layer is a composite layer comprising silicon nitride and silicon oxide.

5. The DRAM as recited in claim 2, wherein the top plate comprises a polysilicon layer doped with arsenic.

6. The DRAM as recited in claim 1, wherein a thickness of the first collar portion and the second collar portion is about 400 Å–500 Å for respectively isolating the neighboring capacitors and sufficiently decreasing a leakage current of the substrate theresurrounding.

7. The DRAM as recited in claim 1, wherein the capacitor further comprises:
   a buried strap conductive layer, above the second collar portion, including a diffusion conductive region in the substrate outside the buried strap conductive layer; and
   a trench top isolation, above the buried strap conductive layer, wherein the trench top isolation connects with the shallow trench isolation regions in a word line direction.

8. The DRAM as recited in claim 7, wherein the buried strap conductive layer further comprises a doped silicon layer and the diffusion conductive region is formed by a thermal process on the doped silicon layer.

9. The DRAM as recited in claim 7, wherein the trench top isolation further comprises a silicon oxide layer.

10. The DRAM as recited in claim 7, wherein two sides of each of the second overlapping portion further comprise a source and a drain of each of the memory cell.

11. The DRAM as recited in claim 1, wherein the shallow trench isolation regions further comprises a silicon oxide layer.

12. The DRAM as recited in claim 1, further comprising a gate oxide layer between the substrate and the word lines.

13. The DRAM as recited in claim 1, wherein the word line further comprises a doped silicon layer and a silicon tungsten layer as a gate electrode.

14. A Dynamic Random Access Memory (DRAM), comprising:
   a plurality of strip-type active areas on a substrate;
   a plurality of shallow trench isolation regions on the substrate for isolating each of the active areas;
   a plurality of word lines above the active areas and the shallow trench isolation regions, an array being formed by overlapping the word lines and the active areas, the array including a plurality of first overlapping portions and a plurality of second overlapping portions, wherein every two of the first overlapping portions is separated by every two of the second overlapping portions on each of the active areas, and each of the first overlapping portions is next to each of the second overlapping portions on every two the neighboring active areas; and
   a capacitor array on the active areas, each of the capacitors being on each of the first overlapping portions, the capacitor comprising:
      a deep trench structure, comprising an upper sidewall region and a lower sidewall region;
      a collar oxide layer, on an upper sidewall portion of the deep trench structure, comprising a first collar portion and a second collar portion, the first collar portion being on an adjacent portion of two of the neighboring capacitors, the second collar portion being on a non-adjacent portion of two of the neighboring capacitors, the first collar portion being longer than the second collar portion in a depth direction of the deep trench structure, the first collar portion being used to isolate the neighboring capacitors and the second collar portion being used to reduce sufficiently a leakage current of the substrate surrounding thereof;
      a buried strap conductive layer, above the second collar portion, including a diffusion conductive region in the substrate outside the buried strap conductive layer; and
      a trench top isolation, above the buried strap conductive layer, wherein the trench top isolation connects with the shallow trench isolation regions in the word line direction;
   wherein a memory cell formed by the word line in one of the second overlapping portions controls the capacitor via the diffusion conductive region in one of the first overlapping portions.

15. The DRAM as recited in claim 14, wherein the deep trench structure of the capacitor comprises:

a bottom plate on an interface region of the substrate and the lower sidewall portion of the deep trench structure;

a dielectric layer, formed on an internal surface of the bottom plate; and a top plate, formed by filling the deep trench structure and covering the dielectric layer with a conductive material.

16. The DRAM as recited in claim 15, wherein the bottom plate is formed by thermal diffusion with an impurity gas to dope the lower sidewall portion of the deep trench structure.

17. The DRAM as recited in claim 15, wherein the dielectric layer is a composite layer comprising silicon nitride and silicon oxide.

18. The DRAM as recited in claim 15, wherein the top plate comprises a polysilicon layer doped with arsenic.

19. The DRAM as recited in claim 14, wherein a thickness of the first collar portion and the second collar portion is about 400 Å–500 Å.

20. The DRAM as recited in claim 14, wherein the buried strap conductive layer further comprises a doped silicon layer and the diffusion conductive region is formed by a thermal process on the doped silicon layer.

21. The DRAM as recited in claim 14, wherein the trench top isolation further comprises a silicon oxide layer.

22. The DRAM as recited in claim 14, wherein the shallow trench isolation regions further comprises a silicon oxide layer.

23. The DRAM as recited in claim 14, further comprising a gate oxide layer between the substrate and the word lines.

24. The DRAM as recited in claim 14, wherein the word line further comprises a doped silicon layer and a silicon tungsten layer as a gate electrode.

25. The DRAM as recited in claim 14, wherein two sides of each of the second overlapping portion further comprise a source and a drain of each memory cell.

26. A deep trench capacitor for Dynamic Random Access Memory (DRAM) comprises:

a deep trench structure;

a bottom plate on an interface region of the substrate and a lower sidewall portion of the deep trench structure;

a dielectric layer, formed on an internal surface of the bottom plate;

a top plate, formed by filling the deep trench structure and covering the dielectric layer with a conductive material;

a first collar portion being on an adjacent portion of the two neighboring capacitors;

a second collar portion being on a non-adjacent portion of the two neighboring capacitors, wherein the first collar portion being longer than the second collar portion in a depth direction of the deep trench and a top surface of the second collar portion being on the same level as a top surface of the top plate; and a buried strap conductive layer on the second collar portion.

27. The deep trench capacitor as recited in claim 26, wherein the capacitor further comprises:

a trench top isolation, above the buried strap conductive layer, wherein the trench top isolation connects with a shallow trench isolation regions in a word line direction.

28. The deep trench capacitor as recited in claim 27, wherein the trench top isolation further comprises a silicon oxide layer.

29. The deep trench capacitor as recited in claim 27, wherein the shallow trench isolation regions further comprises a silicon oxide layer.

30. The deep trench capacitor as recited in claim 26, wherein the buried strap conductive layer further comprises a doped silicon layer and the diffusion conductive region is formed by a thermal process on the doped silicon layer.

31. The deep trench capacitor as recited in claim 26, wherein the buried strap conductive layer including a diffusion conductive region in the substrate outside the buried strap conductive layer.

* * * * *